US008605488B2

(12) United States Patent
Strukov et al.

(10) Patent No.: US 8,605,488 B2
(45) Date of Patent: Dec. 10, 2013

(54) CAPACITIVE CROSSBAR ARRAYS

(75) Inventors: Dmitri Borisovich Strukov, Mountain View, CA (US); Gregory S. Snider, Los Altos, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 270 days.

(21) Appl. No.: 13/256,239

(22) PCT Filed: Jun. 12, 2009

(86) PCT No.: PCT/US2009/047164
§ 371 (c)(1),
(2), (4) Date: Sep. 13, 2011

(87) PCT Pub. No.: WO2010/144092
PCT Pub. Date: Dec. 16, 2010

(65) Prior Publication Data
US 2012/0014170 A1    Jan. 19, 2012

(51) Int. Cl.
*G11C 11/24* (2006.01)
(52) U.S. Cl.
USPC ........................................................ 365/149
(58) Field of Classification Search
USPC ............. 365/46, 94, 100, 113, 129, 148, 149,
365/158, 163; 257/2–5, 9, 296, 310,
257/E21.35, E31.047, E27.006; 438/29, 95,
438/96, 166, 135, 240, 259, 365, 482, 486,
438/597, 785; 977/754
See application file for complete search history.

(56) References Cited

U.S. PATENT DOCUMENTS

| 5,153,681 A | 10/1992 | Kishimoto et al. |
| 5,343,421 A | 8/1994 | Brennan |
| 6,760,245 B2 | 7/2004 | Eaton et al. |
| 2001/0039087 A1 | 11/2001 | Jammy |
| 2003/0121331 A1 | 7/2003 | Reblewski |
| 2005/0082593 A1 | 4/2005 | Lee |
| 2008/0237791 A1 | 10/2008 | Boescke |
| 2009/0003063 A1 | 1/2009 | Mascolo et al. |
| 2011/0051310 A1* | 3/2011 | Strachan et al. ............ 361/281 |
| 2011/0076810 A1* | 3/2011 | Xia et al. ................... 438/129 |
| 2011/0199814 A1* | 8/2011 | Meade ........................ 365/149 |
| 2011/0199815 A1* | 8/2011 | Meade et al. ................ 365/149 |

OTHER PUBLICATIONS

International Search Report, Feb. 24, 2010, PCT/US2009/047791.
Ventra, Massimiliano Di et al.; "Circuit elements with Memory: Memristors, Memcapacitors and Meminductors"; Jan. 23, 2009;p. 1-6; Cornell University; http://arxiv.org/PS_cache/arxiv/pdf/0901/0901.3682v1.pdf.
Mouttet, Blaise; "An Introduction to Memimpedance and Memadmittance Systems Analysis"; Jan. 30, 2009; p. 1-22; Knol BETA; http://knol.google.com/k/anonymous/an-introduction-to-memimpedance-and/23zgknsxnich/5#.
Winker et al, "Floating nano-dot MOS capacitor memory array without cell transistors", Microelectronic Engineering, Jun. 2004, V73/74, pp. 719-724.

* cited by examiner

*Primary Examiner* — Harry W Byrne

(57) ABSTRACT

A capacitive crossbar array includes a first set of conductors and a second set of conductors which intersect to form crosspoints. A nonlinear capacitive device is interposed between a first conductor within the first set and a second conductor within the second set at a crosspoint. The nonlinear capacitive device is configured to store information which is accessible through said first conductor and said second conductor. A method for utilizing a capacitive crossbar array is also provided.

14 Claims, 8 Drawing Sheets

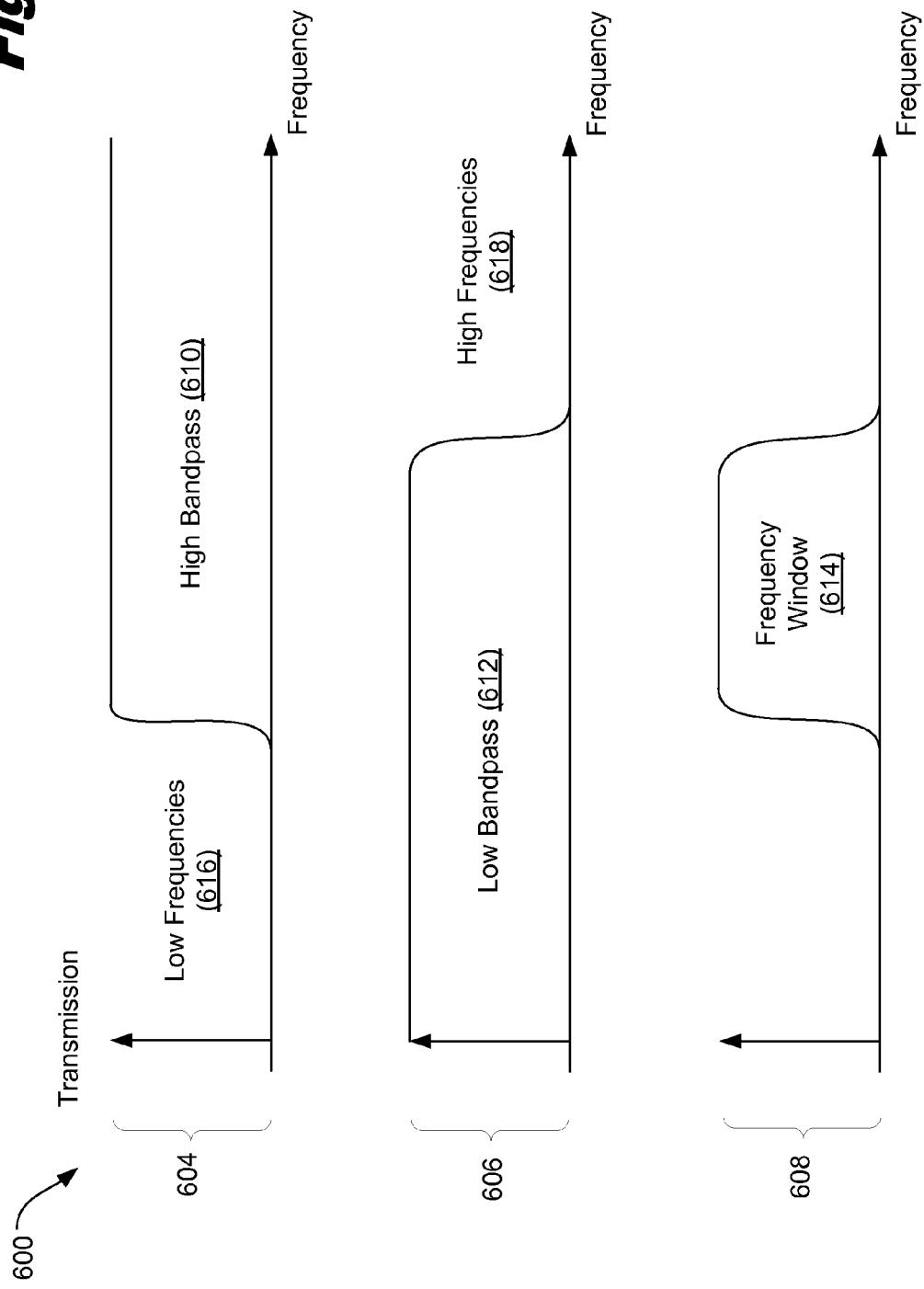

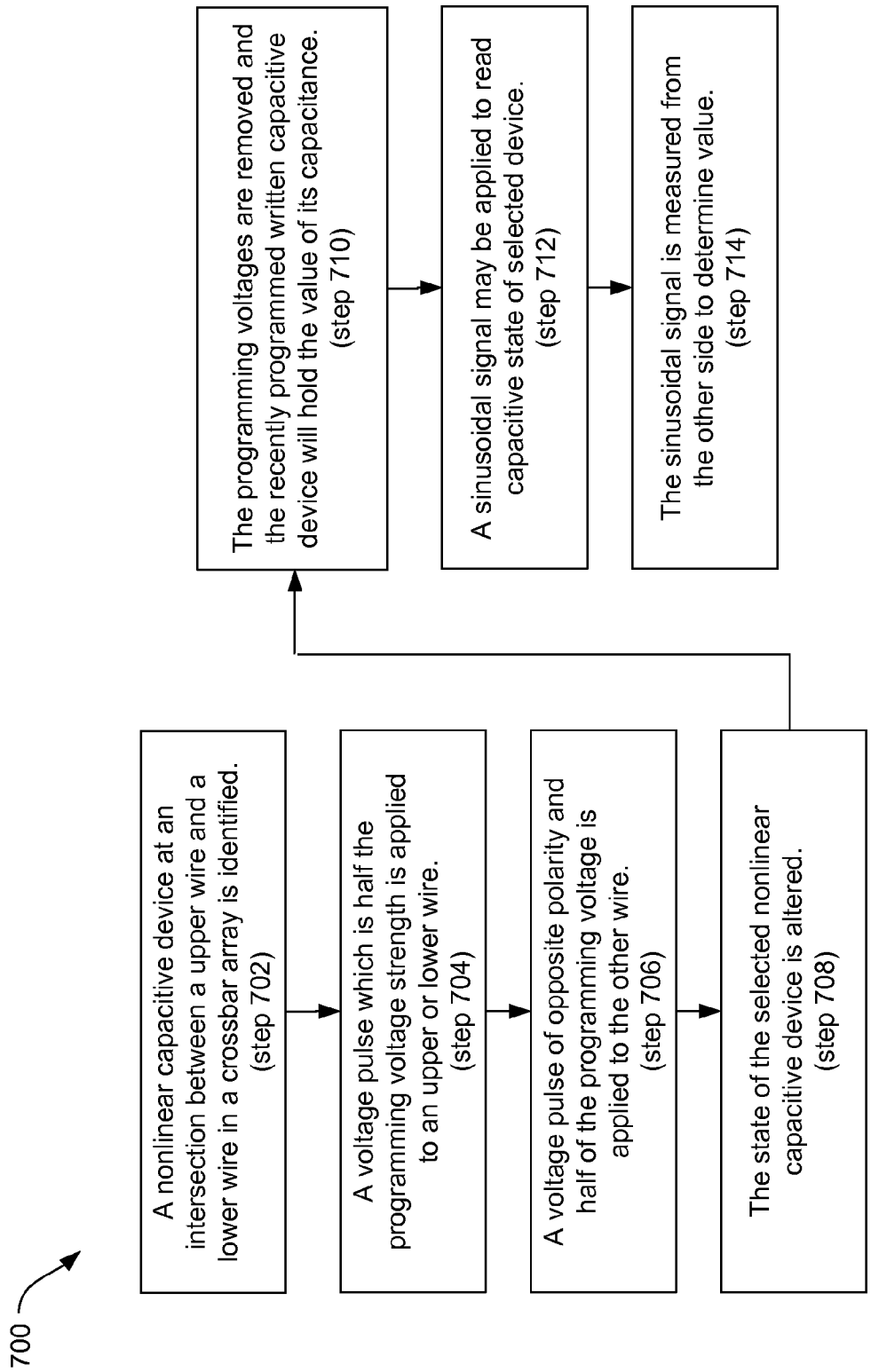

CAPACITIVE CROSSBAR ARRAYS

BACKGROUND

A crossbar array includes a set of upper wires and a set of lower wires. The set of upper wires and lower wires intersect. At each intersection, memory elements are interposed between the upper and lower wires. In some embodiments, each wire in the set of upper wires intersects every wire in the set of lower wires, and vice versa. Consequently, each wire is connected to multiple memory elements. To access a selected memory element at a particular intersection, the correct pair of intersecting wires is selected. Ideally, the memory elements would have nonlinear characteristics which allow the state of a selected memory element to be easily distinguished from other memory elements which are also attached to one of the intersecting wires.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 6 is a graph depicting an illustrative frequency window within which a memcapacitive crossbar array could operate, according to one embodiment of principles described herein.

FIG. 7 is a flow diagram depicting an illustrative process for writing and reading values in a memcapacitive crossbar array, according to one embodiment of principles described herein.

Throughout the drawings, identical reference numbers designate similar, but not necessarily identical, elements.

DETAILED DESCRIPTION

Figure 1A:
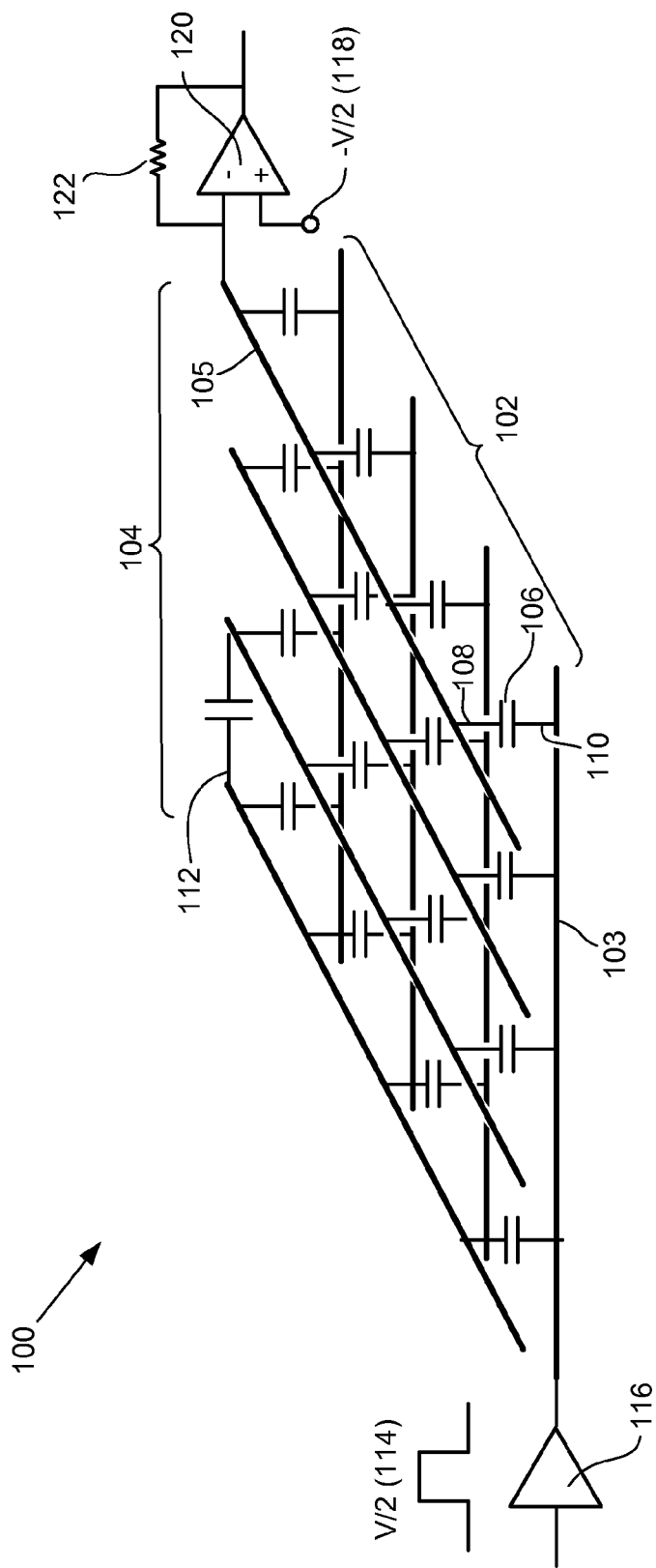
FIG. 1A is diagram of an illustrative crossbar array with capacitive junctions, according to one embodiment of principles described herein.

A crossbar array includes an upper set of parallel wires which is placed perpendicular to a lower set of parallel wires. An intersection where an upper wire intersects a lower wire within the crossbar array is called a "crosspoint" or simply an "intersection." At each crosspoint, a programmable electrical component is interposed between the upper and lower wires at each cross point. According to one illustrative embodiment, the programmable electrical component is designed to hold a data value. That data value can be read or written by applying various programming or reading voltages across the programmable electrical component.

One component able to store a value which has been used is a memristor. A memristor is a programmable resistor which utilizes the motion of dopants within a matrix to change the value of its resistance and hold that value until it is changed again. Thus it retains a memory of experienced electrical conditions. There are several challenges to implementing a crossbar array using memristive junctions at the cross-points. The cross-point resistance cannot be too small or a large electrical current will cause Joule heating and electromigration when even a moderate voltage difference is applied across the memristor. The resistance cannot be too large as higher resistance will cause a higher reading or writing latency in the crossbar system.

The present specification relates to principles and methods for using nonlinear capacitors between the junctions of a crossbar array. Nonlinear capacitive junctions have a number of advantages over resistive junctions, including reduced power loss and heating. These nonlinear capacitors exhibit an increased capacitance as the applied reading voltage is increased. A number of nonlinear capacitors with various geometries and configurations could be used within the crossbar array. For example, Micro Electrical Mechanical System (MEMs) capacitors could be used. These MEMs capacitors can mechanically move conductive plates closer together as a function of applied voltage, thereby generating the desired nonlinearity within the capacitors.

Additionally or alternatively, solid state capacitors could be used which exhibit capacitive nonlinearity. Throughout the specification, a capacitor which contains mobile dopants in a semiconducting matrix (a "memcapacitor") is used as an illustrative example of a nonlinear solid state capacitor. Memcapacitors are non-linear capacitive components which are able to alter and retain the value of their capacitance based on experienced electrical conditions. According to one illustrative embodiment, the use of memcapacitors in a crossbar array can reduce power consumption and improve the speed at which the circuitry is able to operate.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1A is a diagram of an illustrative crossbar array (100) with nonlinear capacitive junctions (106). A crossbar array comprises an upper set of parallel wires (104) which cross a lower set of parallel wires (102) at a nonzero angle. According to one illustrative embodiment, the nanowires of the upper layer (104) are roughly perpendicular, in orientation, to the nanowires of the lower layer (102), although the orientation angle between the layers may vary. At each cross-point, a two terminal capacitive device is interposed between the intersecting wires. For purposes of illustration, only the memcapacitor (106) on the bottom right of the crossbar array (100) is labeled in the figure. One terminal (110) of the capacitor is attached to a wire which is among the lower set of parallel wires (102). The other terminal (108) of the capacitor is attached to a wire which is among the set of upper parallel wires (104).

Though only four wires are shown in each set of parallel wires (102,104), there will typically be a much greater number of wires in each set. Between any set of conducting material including wires, there will be a stray capacitance (112), even if that capacitance is very small. The stray capacitance (112) between parallel wires will typically be much smaller than the capacitance of the capacitors used at each cross-point. As a result, any stray capacitance (112) between parallel wires will be neglected in the following description. In circumstances where stray capacitance is significant, the principles described below can be utilized to determine an optimum operating state for the device.

The capacitive junctions (106) may be used to store a value. In one simple example, a high capacitive state could represent a value "0." Similarly, a low capacitive state could represent the value "1." As discussed above, one embodiment of a nonlinear capacitor is a memcapacitive junction. The internal operation of a memcapacitive junction is described in more detail in FIGS. 3A and 3B. In order to set a specific memcapacitive junction to a particular state, a certain electrical condition may be applied to the junction. Throughout this specification and appended claims, electrical conditions applied to a memcapacitive junction to change its state will be referred to as programming conditions. In one embodiment, the programming condition could be a voltage pulse. One technique for applying a programming voltage may be referred to as the half bias technique. This technique involves the application of a voltage pulse (114) which is half the intended strength to one wire in the first set of parallel wires (102) and a similar voltage pulse (118) but with opposite polarity applied to a wire in the second set of parallel wires (104). All other wires in both sets of parallel wires (102,104) which have not been selected will have a zero voltage bias.

According to one illustrative embodiment, a buffer amplifier (116) may be used on the input end. This could be a standard op-amp (operational amplifier) having unity gain.

When reading the state of a specific memcapacitive junction, an electrical condition which is different from the programming condition may be applied. Throughout this specification and appended claims, the electrical condition applied to read the capacitive state of a memcapacitive junction will be referred to as a reading condition. In one embodiment, the reading condition may be a sinusoidal or AC (Alternating Current) voltage with the amplitude of the full read voltage, for example specified below for the considered device, which is applied to one input end of a wire (103). An inverting op-amp (120) may be placed on an output end of a wire (102). In one embodiment, the op-amp will provide virtual ground to the wire (102) with a negative value of the half read voltage and may have a feedback loop (122). All wires which were not selected are biased at zero voltage. When the sinusoidal voltage runs through a selected wire (103) and into memcapacitors attached to the selected wire (103), an electrical current is generated on the intersecting wire (105). The electrical current has characteristics which are determined by the capacitive state of the memcapacitor which links the two intersecting wires (103, 105). The inverting op-amp (120) receives this electrical current from the upper wire (105). The voltage across the resistor is proportional to the current passing through the resistor multiplied by the resistance of the resistor. In this case, the resistance in the feedback loop (122) is constant while the current varies. Thus, the voltage across the feedback loop (122) will vary proportionately to the current generated in the upper line (105). This voltage may be measured to determine the state of the nonlinear capacitor (106).

Figure 1B:
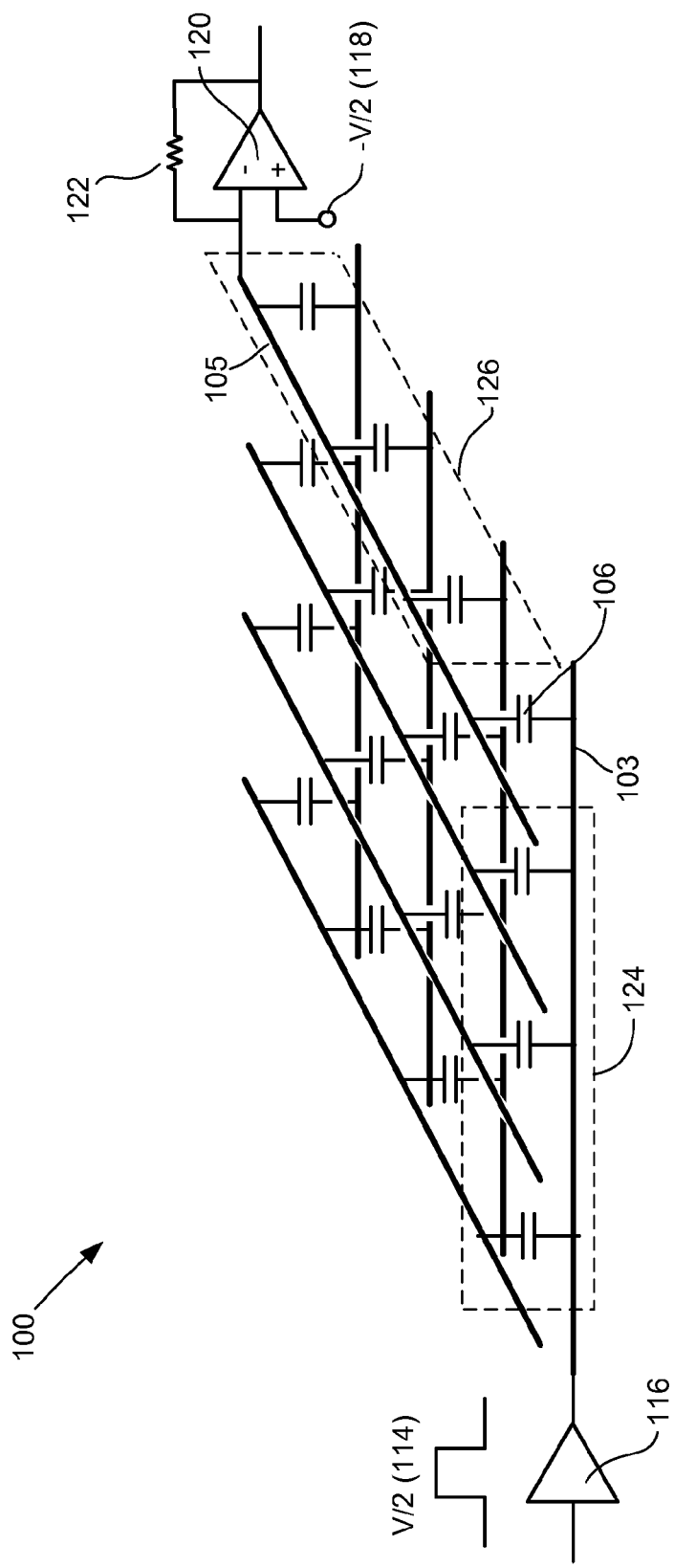
FIG. 1B a diagram of an illustrative crossbar array with capacitive junctions, according to one embodiment of principles described herein.

FIG. 1B is a diagram of an illustrative crossbar array (100) with memcapacitive junctions (106). For purposes of description and clarity, it is useful to distinguish between what will be referred to throughout this specification and appended claims as selected and semi-selected devices. When an electrical condition is applied to a wire (103, 105) from each set of parallel wires (102,104), there will be other devices along those wires which are not at the crosspoint. Throughout the specification and appended claims, devices which are connected to active wires but not at the crosspoint will be referred to as semi-selected devices (124,126). There will typically be two groups of semi-selected devices (124,126), one group (124) along a wire (103) from the lower set of parallel wires (102), and the other group (126) along a wire (105) from the upper set of parallel wires (104). It will be readily apparent to those familiar with the relevant art that a set of capacitive devices in parallel will be equivalent to the sum of the capacitances of each individual device. For reasons which will be detailed below, in order for the crossbar array circuit to function properly, it is desirable for the total capacitance of the semi-selected devices (124,126) to be much smaller than the capacitance of the selected device (106).

Figure 2:
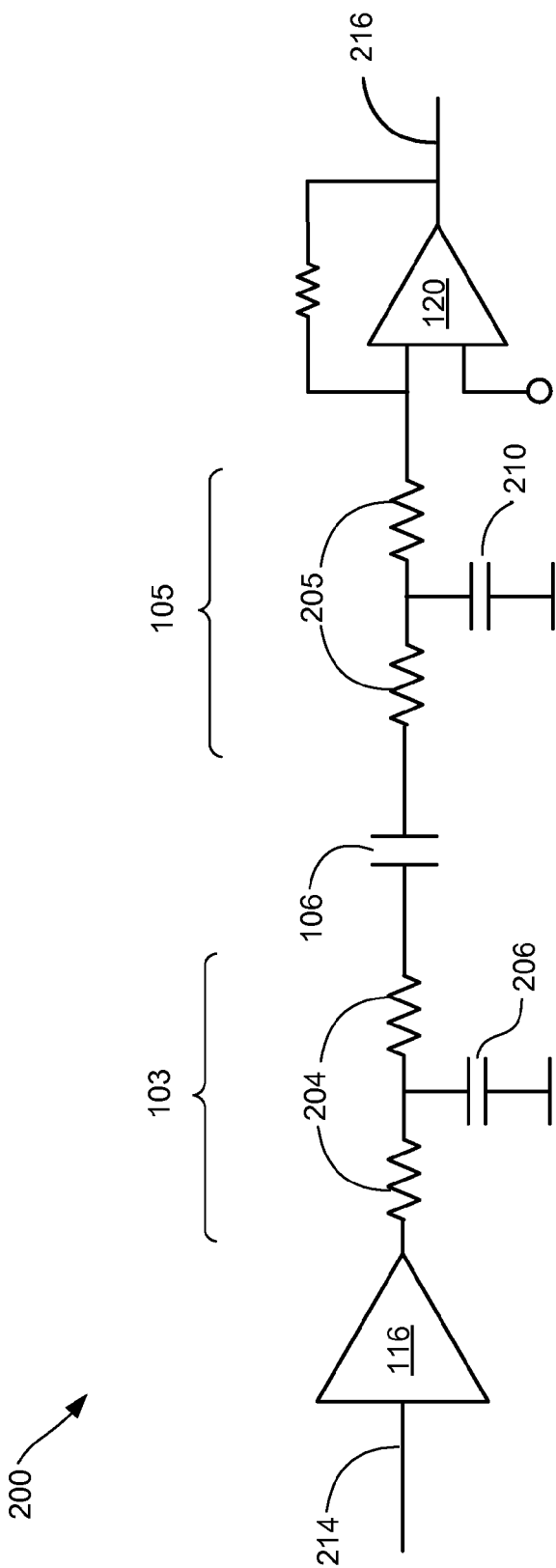
FIG. 2 is a circuit diagram which models an electrical path through selected and semi-selected devices in an illustrative capacitive crossbar architecture, according to one embodiment of principles described herein.

FIG. 2 is an illustrative depiction of a circuit diagram (200) modeling a path through selected (106, FIG. 1) and semi-selected (124,126; FIG. 1) devices in a crossbar array (100, FIG. 1). The circuit diagram (200) described below is a simplified model. It does not take into account every electrical characteristic which may be present in the crossbar array (100, FIG. 1).

The circuit diagram (200) models the path between an input end (214) and an output end (216) on a capacitive crossbar array (100, FIG. 1). As mentioned above, a buffer op-amp (116) may be placed on the input end (214) of a selected wire (103) to be used as a buffer. Every conducting element, including the selected wire (103) will have some resistance even if that resistance is very small. The resistors (204) in the circuit diagram (200) represent the resistance of the lower active wire (103). Similarly, the resistors on the left (205) represent the resistance of the upper active wire (105). The capacitor (206) on the left represents the lumped capacitance of the first group of semi selected devices (124, FIG. 1) which are attached to the lower active wire (103). The middle capacitor (106) represents the capacitance of the selected device (106, FIG. 1). The capacitor (210) on the right represents the lumped capacitance of the second group of semi-selected devices (126, FIG. 1) which are attached to the upper active wire (105). An op-amp (120) may be placed on the output end (216) to be used as a buffer.

According to one illustrative embodiment, the lumped capacitances (206, 210) of the semi-selected devices (124, 126, FIG. 1B) are less than the capacitance (208) of the selected device (106, FIG. 1). As discussed above, nonlinear capacitors are used at each crosspoint. The lumped capacitance of the semi-selected devices (206, 210) are less than the capacitance of the selected device because the selected devices are biased to zero, then voltage equal to the negative of one half of the maximum reading voltage is applied on the upper line (105). The sinusoidal reading voltage is then applied to the input line (214). This generates a maximum voltage across the semi-selected devices (206, 210) of one half the reading voltage, while the maximum bias across the selected capacitor (106) will be the full reading voltage. Because the capacitance is nonlinear, the capacitance at one half the reading voltage can be much smaller than the capacitance at the full bias.

In one embodiment, a memcapacitor could be used between the cross-points on a crossbar array. A memcapacitor is a capacitor which is able to change and hold its state based on experienced electrical conditions. In one illustrative embodiment, the capacitance of the memcapacitors is non-linear as a function of applied voltage. Although memcapacitors may take any of a number of possible embodiments, one illustrative description of basic operational principles of memcapacitors is presented in this specification for purposes of explanation.

A typical capacitor comprises two conducting surfaces with a dielectric material in between. One equation for capacitance is as follows:

$$C = \epsilon_r \epsilon_0 A / d \qquad \text{Eq. 1}$$

where:
C=capacitance measured in farads,
$\epsilon_r$=relative permittivity,
$\epsilon_0$=permittivity of free space,
A=area of conducting surfaces measured in square meters, and
d=distance between conducting surfaces measured in meters.

Figure 3:
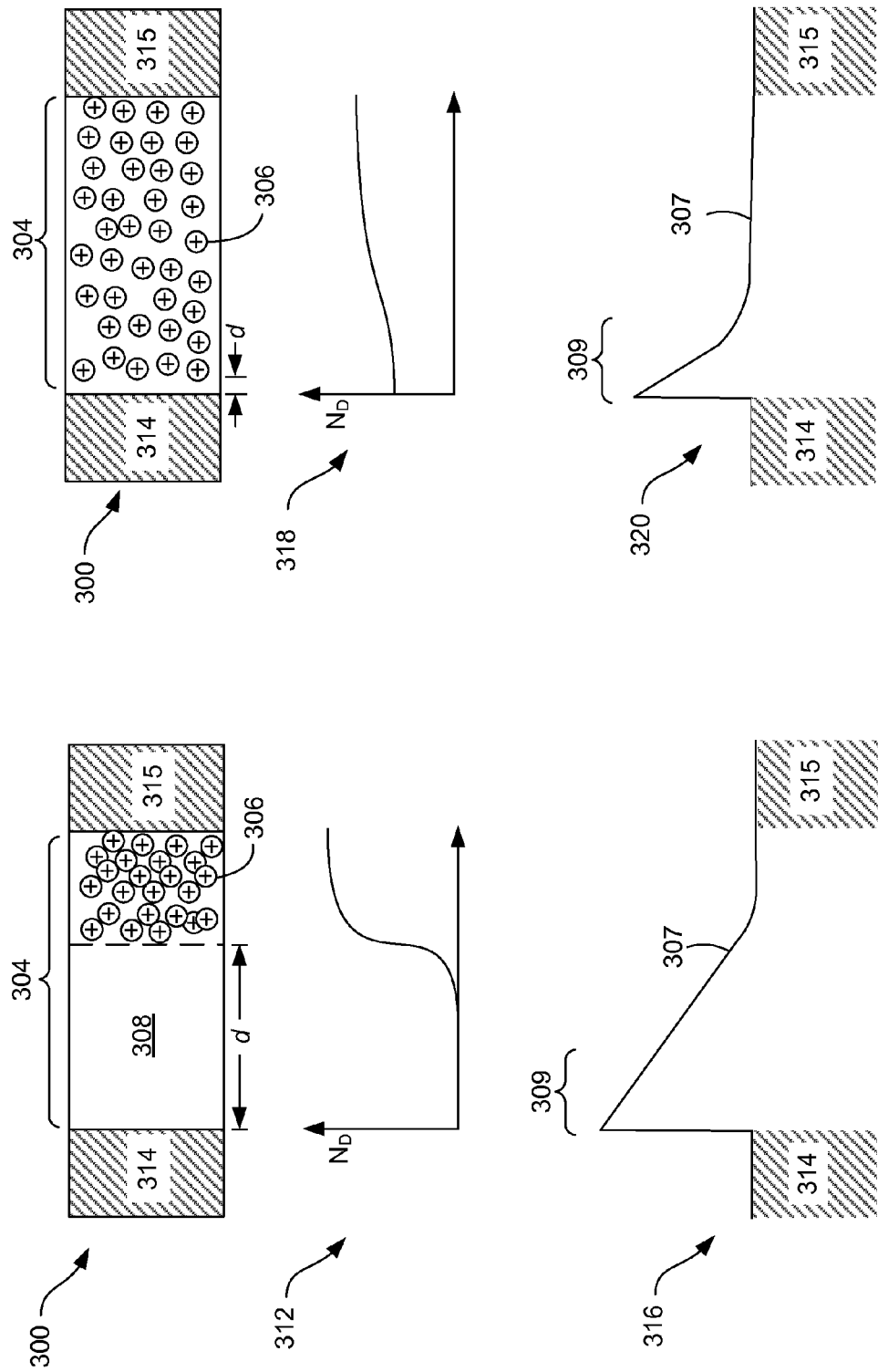
FIG. 3A shows illustrative diagrams of a memcapacitor in a low capacitance state, according to one embodiment of principles described herein.
FIG. 3B shows illustrative diagrams of a memcapacitor in a high capacitance state, according to one embodiment of principles described herein.

FIG. 3A is an illustrative diagram of a memcapacitor (300) in a low capacitive state. The memcapacitor (300) is made up of a memcapacitive matrix (304) interposed between with two electrodes (314, 315). According to one illustrative embodiment, the left and right electrodes (314, 315) are intersecting wires within a crossbar array. The memcapacitive matrix (300) is a semiconducting material which contains a number of mobile dopant ions (306). The ions (306) are considered mobile because they can be repositioned throughout the semiconducting region (304) as a result of an applied programming condition.

Throughout the specification and appended claims, the term "memcapacitor" or "memcapacitive" is used to describe a combination of an insulating/semiconductor matrix and a dopant which exhibits dopant motion in the presence of a programming electrical field and the desired long term dopant stability within the matrix when the programming field is removed. The memcapacitive effect is most strongly evident in nanometer scale devices and allows the device to "remember" past electrical conditions. Throughout the specification and appended claims, the term "memcapacitive matrix" describes a weakly ionic conductive material which is capable of transporting and hosting ions that act as dopants to control the flow of electrons through the memcapacitor. The definition of a weakly ionic conductive material is based on the application for which the memcapacitive device is designed. In general, it is desired for the memcapacitive device to stay in a particular state, either low or high capacitance, for an amount of time that may range from a fraction of a second to years, depending on the application. Thus, the diffusion constant for such a device is, in one embodiment, low enough to ensure the desired level of stability. At the same time the mobility of the ions can be greatly enhanced (with respect to the mobility given by Einstein-Nersnt relation) by increasing internal temperature, e.g. due to Joule heating, or applying very high electric fields during write operation. This desired level of stability avoids inadvertently turning the device from low capacitance to a high capacitance state or vice versa via ionized species diffusion, but allows the intentionally setting the state of the switch with a voltage pulse. Therefore, a "weakly ionic conductor" is one in which the ion mobility, and thus the diffusion constant, is small enough to ensure the stability of the state of the device for as long as necessary under the desired conditions (e.g., the device does not change state because of diffusion of the dopants). In contrast, "strongly ionic conductors" would have large ionized species mobilities and thus would not be stable against diffusion. A number of matrix/dopant combinations may be used, depending on the manufacturing process and the application. For example, silicon may be used as a memcapacitive matrix and lithium ions may be used as the mobile dopant species. Alternatively, titanium dioxide may be used as the memcapacitive matrix and oxygen vacancies may be used as the mobile dopant species.

In a memcapacitor, the two electrodes (314, 315) act as the capacitive plates and the mobile dopants (306) effectively alter the distance d between the plates by creating a highly conductive region which extends from one of the electrodes into the matrix (304). The farther the mobile dopants (306) extend from the electrode into the matrix, the smaller d becomes and the greater the capacitance of the memcapacitor.

A graph (312) shows the density of mobile dopants ($N_D$) through the memcapacitor matrix (304). In the low capacitive state illustrated in FIG. 3A, the mobile dopants (306) are concentrated in the right hand portion of the semi-conducting matrix (304). This dramatically increases the electrical conductivity of the matrix (304) where the mobile dopants (306). In this state, the effective distance d in Eq. 1 is fairly large, leading to a lower overall capacitance of the memcapacitor (304).

At the interface between the undoped portions of the matrix (304) and the electrode (314), there is a large difference in the electrical conductivity and other properties of the across the interface. This creates an interface which exhibits behavior similar to a Schottky barrier. A Schottky barrier is a potential barrier which forms at a metal-semiconductor interface and has diode-like rectifying characteristics. Schottky interfaces are different than a p-n interface in that it has a much smaller depletion width in the metal. In multilayer thin films, the interface behavior may not be exactly the same as a traditional Schottky barrier. Consequently, various interfaces between the illustrative thin films are described as "Schottky-like." At moderate voltages, the Schottky-like barrier (309) allows electrical current to flow in only one direction. The characteristics of the Schottky-like barrier (309) are dependent on a number of factors, including the metal's work function, the band gap of the intrinsic semiconductor which makes up the memcapacitive matrix, the type and concentration of dopants in the semiconductor, and other factors.

The bottom graph (316) shows the electrical potential (307) through the matrix (304). A Schottky barrier (309) exists at the interface (309). Because the mobile dopants (306) are concentrated in the right side of the matrix (304), the potential barrier is high and wide at the interface between the left electrode (314) and the matrix (304). As discussed above, this produces a relatively low capacitance junction (300) because the conducting surface of the mobile dopants (shown by a dotted line which extends across the matrix) is relatively far away from the left electrode (314). As shown above in Eq. 1, the larger the distance between conducting surfaces (all other factors remaining constant) the lower the capacitance will be.

FIG. 3B is an illustrative diagram of a memcapacitor (300) in a high capacitance state. The mobile dopants (306) have been distributed through the matrix (304) by a programming voltage or condition such that the mobile dopants (306) are much closer to the left electrode (314). This brings the conducting surfaces of the capacitor (300) much closer together. The middle graph (318) of FIG. 3B shows a more uniform distribution of mobile dopants (306) through the matrix. The bottom graph (320) shows that the Schottky barrier (309) is much narrower and possibly lower at the interface.

As discussed above, once the mobile dopants have been distributed by the application of a programming condition, they remain stable for a desired duration and through one or more read cycles. According to one illustrative embodiment, the programming conditions may include a voltage which exceeds the breakdown voltage of the Schottky barrier. The barrier then becomes conductive and allows current to flow through the matrix. This heats the matrix and increases the mobility of the dopants. This breakdown process is nondestructive and reversible, so long as the amount of current flowing does not reach levels that cause the semiconductor material to overheat and cause thermal damage.

The dopants then move under the influence of an applied electrical field to the desired location. The programming condition is removed and the matrix cools. The mobile dopants then remain in substantially the same position.

According to one illustrative embodiment, the memcapacitive junctions exhibit significant nonlinear capacitance in the high capacitance state. This nonlinear capacitance is generated by the interaction of the Schottky barrier with the reading voltage. The Schottky barrier (or other interface, such as p-n junction or metal-oxide-semiconductor interface) creates a depletion region. The depletion region is empty of conducting electrons and holes, but may contain a number of mobile dopants. The depletion region with its dopants inside behaves like a capacitor. By varying the voltage applied to the interface it is possible to vary the depletion width, and consequently the capacitance of the interface.

Figure 4:
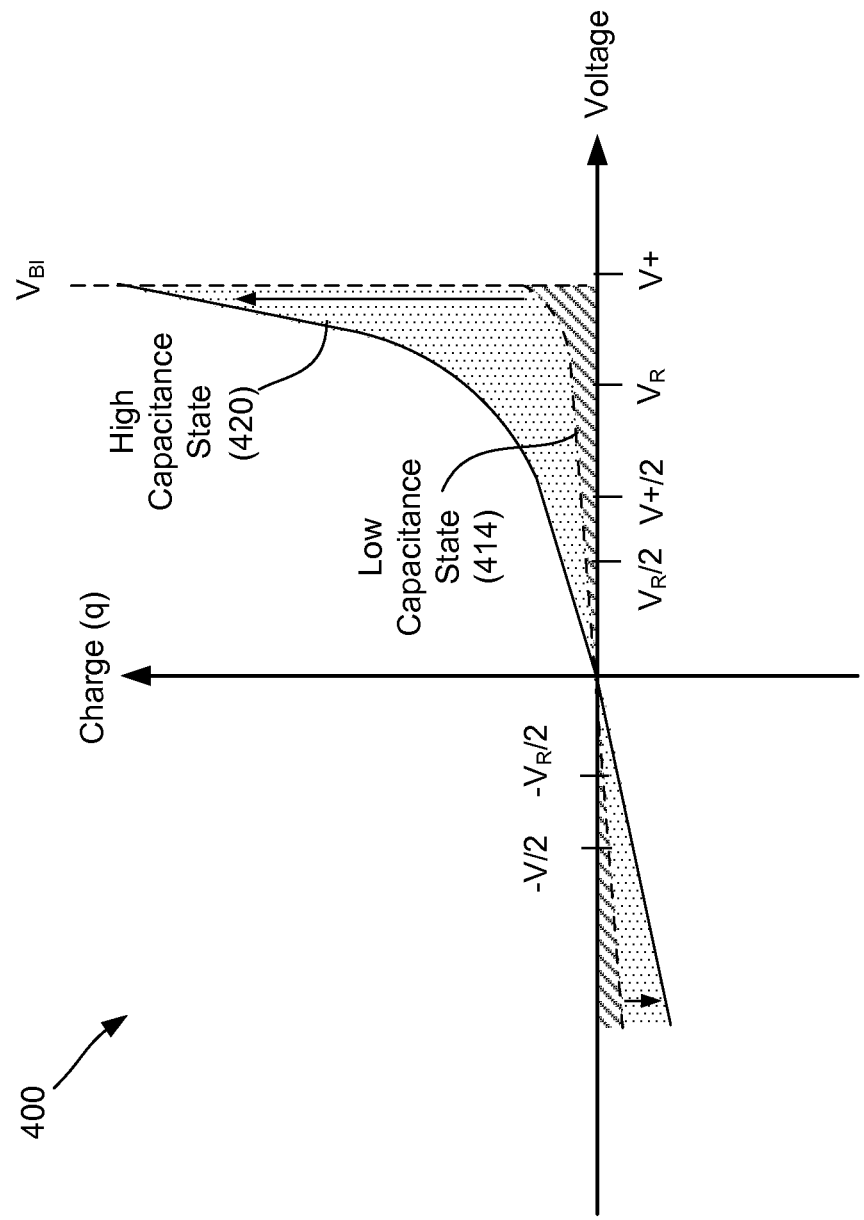
FIG. 4 is a graph depicting an illustrative nonlinear relationship between voltage and charge in a capacitor, according to one embodiment of the principles described herein.

The nonlinear capacitance across a Schottky barrier (or other interface containing a depletion region) is nonlinear and is given by Eq. 2 below.

$$C(N_D, v) = \sqrt{\frac{\varepsilon_r \varepsilon_0 N_D}{q(V_{BI} - v)}} \quad \text{Eq. 2}$$

where:
C=capacitance measured in farads,
$\varepsilon_r$=relative permittivity of the insulator between the charged plates,
$\varepsilon_0$=permittivity of free space,
$N_D$=the number of dopants,
q=charge, which is a function of applied voltage,
$V_{BI}$=built in voltage of the Schottky barrier, and
v=applied voltage FIG. 4 is a graph which shows an illustrative nonlinear relationship between charge and applied voltage across a Schottky interface within a memcapacitor. The horizontal axis represents voltage applied to the interface. The vertical axis represents the resulting charge. Two curves are shown, a dash-dot curve (414) represents the charge as a function of voltage for the low capacitance state and a solid curve (420) represents the charge as a function of voltage for the high capacitance state. These two curves (414, 420) correspond to the states shown in FIGS. 3A and 3B, respectively. The arrows between the dash-dot line and the solid line illustrate the change in the charge/voltage relationship as the mobile dopants are reconfigured from the low capacitance state to the high capacitance state.

The low capacitance curve (414) shows little non-linearity and less sensitivity to changes in applied voltage. However, the high capacitance curve (420) shows significant nonlinearity in the number of charges present at a particular voltage applied voltage. For example, a relatively small charge is present when a voltage of $V_R/2$ is applied to the interface, but a much greater charge is present when a voltage of $V_R$ is applied. As discussed above, a voltage of $V_R/2$ is applied across a first intersecting line and a second voltage of $-V_R/2$ is applied over the second intersecting line. The memcapacitive junction which is interposed between the two intersecting line then sees a voltage of $V_R$.

The vertical dashed line labeled $V_{BI}$ represents the breakdown voltage (or built-in voltage) of the memcapacitive junction. According to one illustrative embodiment, the breakdown voltage (410) may be approximately three volts. When the applied voltage exceeds the breakdown voltage, the memcapacitive junction becomes conductive and electrical current passes through the junction. As discussed above, this can result in resistive heating of the matrix and a corresponding increase in the mobility of the mobile dopants. Consequently, the reading voltage across any given junction does not typically exceed the breakdown voltage. However, in some circumstances it can be desirable for the programming conditions to be such that the breakdown voltage is exceeded. This can significantly reduce the write time of the device because of the increase in dopant mobility.

Similar to the application of the reading voltage above, the programming voltage is applied by dividing the programming voltage into two portions, V/2 and −V/2. These voltages are applied to two intersecting lines so that only the selected device which is at the intersection is reprogrammed by the programming voltage V+.

Figure 5:
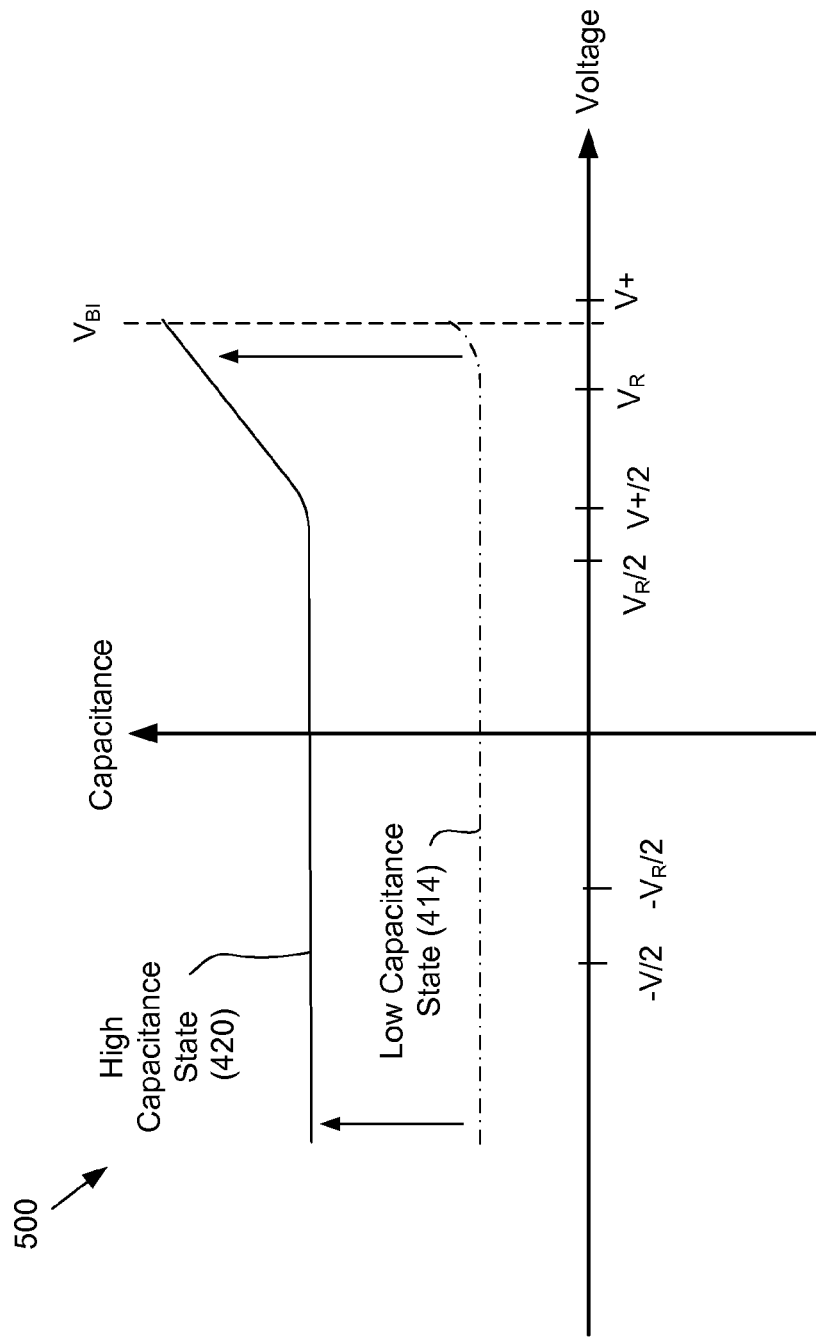
FIG. 5 is a graph depicting an illustrative nonlinear relation between applied voltage and capacitance in a capacitor, according to one embodiment of principles described herein.

FIG. 5 is a graph depicting a nonlinear relation between applied voltage and capacitance of a memcapacitor. In general, the capacitance of the memcapacitor is related to the slope (the derivative) of the charge/voltage curve shown in FIG. 4. In the graph, the horizontal axis represents voltage (404) while the vertical axis represents capacitance (402). The curve (420) showing the capacitance as a function of voltage is shown on the graph (400). It can be seen that for most voltage values, the capacitance curve is relatively constant. Only as the applied voltage approaches $V_R$ does the capacitance get higher in value. The label "$V_R/2$" refers to half of the voltage applied to a selected memcapacitor (106, FIG. 1). Likewise, the label "$-V_R/2$" refers to a negative polarity of half of the voltage applied to a selected memcapacitor (106, FIG. 1).

As mentioned above, it is desirable that the lumped capacitance of semi-selected devices (124,126; FIG. 1) be less than the capacitance of the selected memcapacitor (106, FIG. 1). This statement may be summed up in the following relation:

$$N^* C_j(V_R/2) < C_j(V_R) \quad \text{Eq. 3}$$

where:
N=the number of semi-selected memcapacitors,
$C_j$=the capacitance of the memcapacitors in the crossbar array as a function of voltage
$V_R$=the reading voltage The left side of the Eq. 3 represents the lumped capacitance of the semi-selected memcapacitors at one half the reading voltage and the right side represents the capacitance of the selected device at the full reading voltage. As mentioned above, a half-bias technique may be used in which "$V_R/2$" is applied to one wire on the first set of parallel wires and "$-V_R/2$" is applied to one wire on the second set of parallel wires. This will ensure that all semi-selected devices have only half the voltage applied to them as is applied to the selected memcapacitor. As can be seen from FIG. 5, the capacitance of the junction in the high capacitance state (420) is relatively small at $V_R/2$ compared with the capacitance at $V_R$ due to the nonlinearity of the capacitance/voltage behavior of the memcapacitor. This nonlinearity allows Eq. 3 to be satisfied with a larger number of semi-selected devices. Consequently, larger crosspoint arrays can be built. The exact number of semi-selected devices able to be placed into a crossbar array may vary depending on various characteristics of the crossbar array and memcapacitive junctions.

FIG. 6 is an illustrative diagram (600) depicting an exemplary frequency window within a memcapacitive crossbar array (100, FIG. 1) could operate in. As mentioned above, to read the state of a selected memcapacitive junction (106, FIG. 1), a sinusoidal voltage could be applied through the system. Due to its electrical characteristics, the selected memcapacitor acts as a high pass filter, allowing only higher frequencies through while cutting off lower frequencies. The semi-selected devices act as a low pass filter, allowing lower frequencies to pass while cutting off higher frequencies. When the relationship given by Eq. 3 is satisfied there will always be a frequency window in which a selected nonlinear capacitor in a high capacitance state passes the reading pulse from one of the intersecting wires to another. Conversely, the low capacitance state would not exhibit this window of transparency. This allows the state of the nonlinear capacitor to be determined through the application of voltage pulse or pulses which have a given frequency.

Each graph in FIG. 6 has a horizontal axis denoting frequency. The vertical axis illustrates the strength of the signal transmitted through the filter. The top graph (604) shows a high pass filter (610). As mentioned above, the high pass filter cuts off the lower frequencies (616). According to one illustrative embodiment, this high pass filter may formed by the resistance in the wires and the capacitance of the selected memcapacitor (106, FIG. 1). The cutoff frequency of the filter is based upon a time constant. The time constant is determined by the equation below:

$$T=1/(R*C_j(V_R))$$ Eq. 4 where:
T=the time constant,
R=the resistance of the wires in the cross bar array, and
$C_j$=the capacitance of the memcapacitors in the crossbar array as a function of voltage
$V_R$=the reading voltage The middle graph (606) shows a low pass filter (612). As mentioned above, a low pass filter (612) cuts off the higher frequencies (618). The time constant for the low pass filter is determined by the following equation:

$$T=1/(R*N*C_j(V_R/2))$$ Eq. 5 where:
T=the time constant,
R=the resistance of the wires in the cross bar array, and
$C_j(V_R/2)$=the capacitance of the semi-selected devices as a function of half the applied voltage,
N=number of semi-selected devices.

The bottom graph (608) shows the frequency window (614) which is the result of combining the filters shown in the upper and middle graphs. This window is between the cutoff frequency of the high pass filter and the cutoff frequency of the low pass filter. According to one illustrative embodiment, the sinusoidal reading voltage has a frequency within the frequency window (614). Eq. 6 describes the frequency of the reading voltage as a function of the nonlinear capacitances of the memory devices which are within the crossbar array.

$$1/(R*C_j(V_R)) \leq f \leq 1/(R*N*C_j(V_R/2))$$ Eq. 6 where:
R=the resistance of the wires in the cross bar array,
$C_j(V_R)$=the capacitance of the selected device as a function of applied voltage.
f=the frequency of an applied sinusoidal signal, and
$C_j(V_R/2)$=the capacitance of the semi-selected devices as a function of half the applied voltage.
N=number of semi-selected devices.

In one illustrative example, the high pass filter formed by the selected memcapacitor may cut off all frequencies below 900 MHz (Megahertz) and the low pass filter formed by the semi-selected memcapacitors will cut off all frequencies above 1 GHz (Gigahertz). This means that the applied sinusoidal signal used to read the capacitive state of the selected memcapacitor should be above 900 MHz and below 1 GHz.

FIG. 7 is an illustrative flow diagram (700) depicting the process for writing and then reading values in a memcapacitive crossbar array. First, whatever addressing method used by the system employing a crossbar array identifies a nonlinear capacitive device to store a particular value (step 702). That value is set by altering the capacitive state of the nonlinear capacitive device. The programming voltage needed to alter the capacitive state of a memcapacitor already known by the system. To set the capacitive state, a voltage pulse half the needed strength is applied to a wire from a first set of parallel wires, the wire being connected to the selected nonlinear capacitor (step 704). Next, a voltage pulse opposite in polarity and half the needed strength is applied to a wire from a second set of parallel wires, the wire being connected to the other side of the selected nonlinear capacitor (step 706). The combined voltage from both directions alters the capacitive state of the selected nonlinear capacitor (step 708). The programming voltages are then removed and the recently programmed nonlinear capacitor will remain in a stable state and hold its value for a period of time (step 710). To read the value stored by a memcapacitive device, a sinusoidal signal may be applied to a wire from the first set of parallel wires, the wire being connected to the device intended to be read (step 712). The same half biasing scheme similar to write operation is applied to ensure the proper reading of the selected device, as described above. The frequency of the sinusoidal signal should be within a range specified by the characteristics of the crossbar array. The sinusoidal signal is then measured from a wire on a second set of parallel wires, the wire being connected to the other side of the nonlinear capacitor. The signal may be measured through any appropriate means. The value stored in the intended memcapacitor can then be determined (step 714).

In sum, a variety of nonlinear capacitance devices may be interposed between intersecting wires in a crossbar array. These nonlinear capacitive devices may be memcapacitors, MEMs capacitors, p-n junction devices, MOSFET devices or other suitable devices. The nonlinear capacitance of the devices allows the state of a selected junction to be read without being obscured by capacitance of semi-selected devices. The advantages of using nonlinear capacitive junctions may include a reduction in power consumption (compared to resistive crossbar arrays) and improvement in operational speed.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:
1. A capacitive crossbar array comprises:
a first set of conductors;

a second set of conductors, the first set of conductors intersecting the second set of conductors to form crosspoints;

a nonlinear capacitive device interposed between a first conductor within the first set and a second conductor within the second set at a crosspoint; the nonlinear capacitive device being configured to store information which is accessible through said first conductor and said second conductor.

2. The array according to claim 1, in which each conductor in the first set of conductors intersects all of the conductors in the second set of conductors to form crosspoints, a nonlinear capacitive device being formed at each crosspoint.

3. The array according to claim 1, in which the information is encoded into the nonlinear capacitive device as a high capacitance or a low capacitance state, the high capacitance state having greater capacitive nonlinearity than the low capacitance state.

4. The array according to claim 1, further comprising a reading voltage pulse train, the reading voltage pulse train having a characteristic voltage of $V_R$ and a frequency defined by:

$$1/(R*C_j(V_R)) \leq f \leq 1/(R*N*C_j(V_R/2))$$

where R is the resistance of conductors in the cross bar array; $C_j$=the capacitance of nonlinear capacitive devices in the capacitive crossbar array as a function of the characteristic voltage $V_R$; N is a number of semi-selected devices; and f is a frequency of the reading voltage pulse train.

5. The array according to claim 1, in which the nonlinear capacitive device is a solid state nonlinear capacitor having a depletion region which exhibits nonlinear capacitance as a function of an applied reading voltage.

6. The array according to claim 5, in which the solid state nonlinear capacitor is a memcapacitor comprising a memcapacitive matrix and mobile dopants.

7. The array according to claim 6, in which the memcapacitor further comprises a Schottky barrier at an interface between the memcapacitive matrix and one of the first conductor and second conductor, the Schottky barrier exhibiting nonlinear capacitance as a function of the applied reading voltage.

8. The array according to claim 6, in which a programming voltage applied to alter the state of the memcapacitor exceeds the breakdown voltage for the Schottky barrier.

9. The array according to claim 1, further comprising semi-selected capacitive devices, the nonlinear capacitive device being configured such that the lumped capacitance of the semi-selected devices at a first reading voltage is less than the capacitance of the selected device at a second reading voltage.

10. The array according to claim 9, in which the first reading voltage has approximately one half the magnitude of the second reading voltage.

11. A method for utilizing a capacitive crossbar array comprises:

applying a programming voltage across a nonlinear capacitive device, the nonlinear capacitive device being interposed between an upper wire and a lower wire of the capacitive crossbar array;

altering a capacitive state of the nonlinear capacitive device;

removing the programming voltage, the capacitive state of the nonlinear capacitive device remaining substantially stable until another programming voltage is applied;

applying a reading voltage; and detecting the capacitive state of the nonlinear capacitive device.

12. The method according to claim 11, in which the nonlinear capacitive device is a memcapacitor, the programming voltage exceeding a breakdown voltage of the memcapacitor such that electrical current flows through the memcapacitor, thereby increasing the mobility of mobile dopants within the memcapacitor.

13. The method according to claim 11, in which applying the programming voltage further comprises:

dividing the programming voltage into two sub-voltages;

applying one of the sub-voltages to the upper wire; and applying the other sub-voltage to the lower wire such that the nonlinear capacitive device is subject to the sum of the sub-voltages.

14. The method of claim 11, in which applying the reading voltage comprises:

applying a voltage pulse train to one of the upper wire and lower wire; and detecting the transmission of the voltage pulse train through the nonlinear capacitive device to the other wire.

* * * * *

UNITED STATES PATENT AND TRADEMARK OFFICE
CERTIFICATE OF CORRECTION

PATENT NO.       : 8,605,488 B2                              Page 1 of 1
APPLICATION NO.  : 13/256239
DATED            : December 10, 2013
INVENTOR(S)      : Dmitri Borisovich Strukov et al.

It is certified that error appears in the above-identified patent and that said Letters Patent is hereby corrected as shown below:

In the Claims

In column 11, line 22, in Claim 4, delete "$1/(R*C_j(V_R)) \leq f \leq 1/(R*N*C_j(V_R/2))$" and insert -- $1/(R*C_j(V_R)) < f < 1/(R*N*C_j(V_R/2))$ --, therefor.

Signed and Sealed this
Thirteenth Day of May, 2014

Michelle K. Lee
*Deputy Director of the United States Patent and Trademark Office*